United States Patent [19]

Nakamura

[11] Patent Number: 5,740,052
[45] Date of Patent: Apr. 14, 1998

[54] METHOD AND APPARATUS FOR MANUFACTURE OF SEMICONDUCTOR DEVICES

[75] Inventor: Gen Nakamura, Utsunomiya, Japan

[73] Assignee: Canon Kabushiki Kaisha, Tokyo, Japan

[21] Appl. No.: 651,038

[22] Filed: May 17, 1996

[30] Foreign Application Priority Data

May 23, 1995 [JP] Japan ................................. 7-146868

[51] Int. Cl.$^6$ ................................................. B65G 49/07
[52] U.S. Cl. ........................... 364/468.28; 364/468.19; 364/478.01; 364/478.16; 414/222; 414/940
[58] Field of Search ................. 364/468.28, 468.19, 364/468.2, 478.01, 478.02, 478.05, 478.06, 478.07, 478.16, 478.18; 414/222, 416, 940

[56] References Cited

U.S. PATENT DOCUMENTS

| | | | |
|---|---|---|---|
| 4,062,463 | 12/1977 | Hillman et al. | 414/225 |
| 4,248,508 | 2/1981 | Watkin | 353/114 |
| 4,549,843 | 10/1985 | Jagusch et al. | 414/416 |
| 4,570,279 | 2/1986 | Yoshizawa | 414/225 |
| 4,676,637 | 6/1987 | Uto et al. | 356/237 |
| 4,746,256 | 5/1988 | Boyle et al. | 414/217 |
| 4,757,355 | 7/1988 | Iizuka et al. | 355/75 |
| 4,758,127 | 7/1988 | Imai et al. | 414/416 |
| 4,984,953 | 1/1991 | Nakazato et al. | 414/331 |
| 4,999,671 | 3/1991 | Iizuka | 355/97 |
| 5,026,239 | 6/1991 | Chiba et al. | 414/222 |
| 5,097,421 | 3/1992 | Maney et al. | 364/468.2 |
| 5,191,535 | 3/1993 | Terao | 364/468.28 |

*Primary Examiner*—James P. Trammell
*Assistant Examiner*—Eric W. Stamber
*Attorney, Agent, or Firm*—Fitzpatrick, Cella, Harper & Scinto

[57] ABSTRACT

A semiconductor device manufacturing apparatus and method includes a reticle library for accommodating therein a first reticle cassette, a cassette table for holding thereon a second reticle cassette of a shape different from that of the first reticle cassette, a first opening and closing mechanism for opening/closing the first reticle cassette in accordance with a predetermined first sequence, a second opening and closing mechanism for opening/closing the second reticle cassette in accordance with a predetermined second sequence different from the first sequence, a reticle stage for holding a reticle as unloaded from the first reticle cassette, for use of the reticle in the apparatus, a reticle hand for conveying a reticle as unloaded from the reticle stage, and a controller operable to discriminate one of the first and second reticle cassettes into which one cassette the reticle as unloaded from the reticle stage is to be accommodated, on the basis of reticle control information. The controller is also operable to move, through the reticle hand, the reticle into the first reticle cassette as being opened by the first opening and closing mechanism when the controller concludes that the reticle is to be accommodated in the first reticle cassette. The controller is also operable to move, through the reticle hand, the reticle into the second cassette as being opened by the second opening and closing mechanism when the controller concludes that the reticle is to be accommodate in the second reticle cassette.

7 Claims, 3 Drawing Sheets

METHOD AND APPARATUS FOR MANUFACTURE OF SEMICONDUCTOR DEVICES

FIELD OF THE INVENTION AND RELATED ART

This invention relates generally to a method and apparatus for the manufacture of semiconductor devices. More particularly, the invention is concerned with automation of reticle conveyance, for example, in a semiconductor device manufacturing apparatus, wherein an original such as a photomask or reticle, is to be used.

In order to prevent adhesion of foreign particles to a reticle, to meet the requirement of further miniaturization of a semiconductor device, semiconductor device manufacturing apparatuses use a mechanism for automatically unloading a reticle from a reticle cassette, which accommodates reticles therein, and for automatically conveying the reticle to an exposure station. Also, in order to avoid adhesion of foreign particles to a reticle, an operator manages the number of operations in which that the reticle is used, to determine execution of a reticle cleaning operation, an inspection operation for adhesion of foreign particles on the reticle, and an inspection operation for any fault of a pattern of the reticle, and so on.

In such an operational environment and apparatus environment, reticle cassettes to be used in a reticle cleaning system, a reticle foreign-particle inspecting system, a reticle pattern-fault inspecting system or the like, have different shapes peculiar to these systems, respectively. There is no unification or compatibility in the shape. For this reason, if a reticle having been cleaned by the reticle cleaning system is to be loaded into the semiconductor device manufacturing apparatus, it is necessary to transfer the reticle from a reticle cassette for the reticle cleaning system into a reticle cassette for the semiconductor device manufacturing apparatus. To this end, the operator carries a reticle cassette having a reticle kept therein and a vacant reticle cassette for the semiconductor device manufacturing apparatus, into a clean room and executes transfer of the reticle between them.

SUMMARY OF THE INVENTION

This process receives the operator to enter a clean room every time a reticle is to be transferred. Since the number of reticles to be used is increasing, it prolongs the reticle transfer operations performed by the operator. Also, the manual reticle transfer operation does not avoid particle adhesion completely even if it is done carefully.

A reticle transfer mechanism has been proposed in an attempt to decrease the work time and reduce particle adhesion. However, in such a mechanism, there is an operation for loading a cassette into which a reticle is to be transferred. Since the cassette has to be loaded manually by an operator, there is a possibility that a reticle which is not to be transferred is transferred by an error of the operator so that the reticle, which is not going to be used, is loaded into the semiconductor device manufacturing apparatus. If this occurs, the operation of the semiconductor device manufacturing apparatus will be stopped or an erroneous operation will occur.

Further, the reticle transfer mechanism has to be installed in a clean room. This requires a very large clean room, and it increases the cost of the apparatus or settings.

In is an object of the present invention to provide a method or apparatus for the manufacture of semiconductor devices, for example, wherein transfer of an original, such as a reticle, is executed efficiently while reducing adhesion of foreign particles to the reticle.

In accordance with an aspect of the present invention, there is provided a semiconductor device manufacturing apparatus, comprising: cassette accommodating means for accommodating a first cassette for storing an original therein; conveying means for unloading the original out of the first cassette in the cassette accommodating means and for conveying the original into the apparatus so that the original is used or processed therein; cassette mounting means for mounting a second cassette having a shape different from that of the first cassette; and conveying means for discriminating whether the original unloaded out of the first cassette, for use or for a process in the apparatus, is to be moved, after the use or the process, back to the first cassette or the second cassette on the basis of information related to the original and stored in the apparatus, and then for moving the original to one of the first cassette the second cassette.

The apparatus may further comprise display means for displaying, to an operator, whether the original is moved to the first cassette or the second cassette.

The conveying means may use one of information supplied thereto from an operational unit for controlling the apparatus and information stored in said apparatus, to execute the discrimination.

In the structure described above, the original unloaded out of the cassette accommodated in the cassette accommodating means may be conveyed to the apparatus and may be used or processed therein.

Discrimination may be made as to whether the original having been used or processed is to be moved back to the same cassette so that the original is to be used or processed in the same apparatus, or it is to be moved back to a separate cassette, having a different shape, so that the original is to be used in an apparatus for use with a cassette of different shape, wherein discrimination may be made on the basis a selected one of original management information supplied from operational means to control means, for controlling the conveying means, and original management information prepared in the apparatus.

The original with which the discrimination has been executed may be moved back to an appropriate cassette, in accordance with the original management information selected by an operator.

After the original is moved back into a cassette by the conveying means, the control means may operate to cause display means to perform display, for an operator, concerning the cassette into which the original has been moved back.

In accordance with this aspect of the present invention, after the original is used or processed, an apparatus which is to be used subsequently is discriminated automatically without any manual operation or additional mechanism, and the original is transferred automatically to a cassette which is to be used with the subsequent apparatus. This prevents adhesion of particles to the original during the original transfer operation.

Since the original transfer operation is based on the information Within the apparatus, unwanted stoppage of the operation due to an error in original transfer, for example, is avoided. The work time of the operator is reduced, and the rate of operation of the apparatus as well as the operation efficiency of the operator increase.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
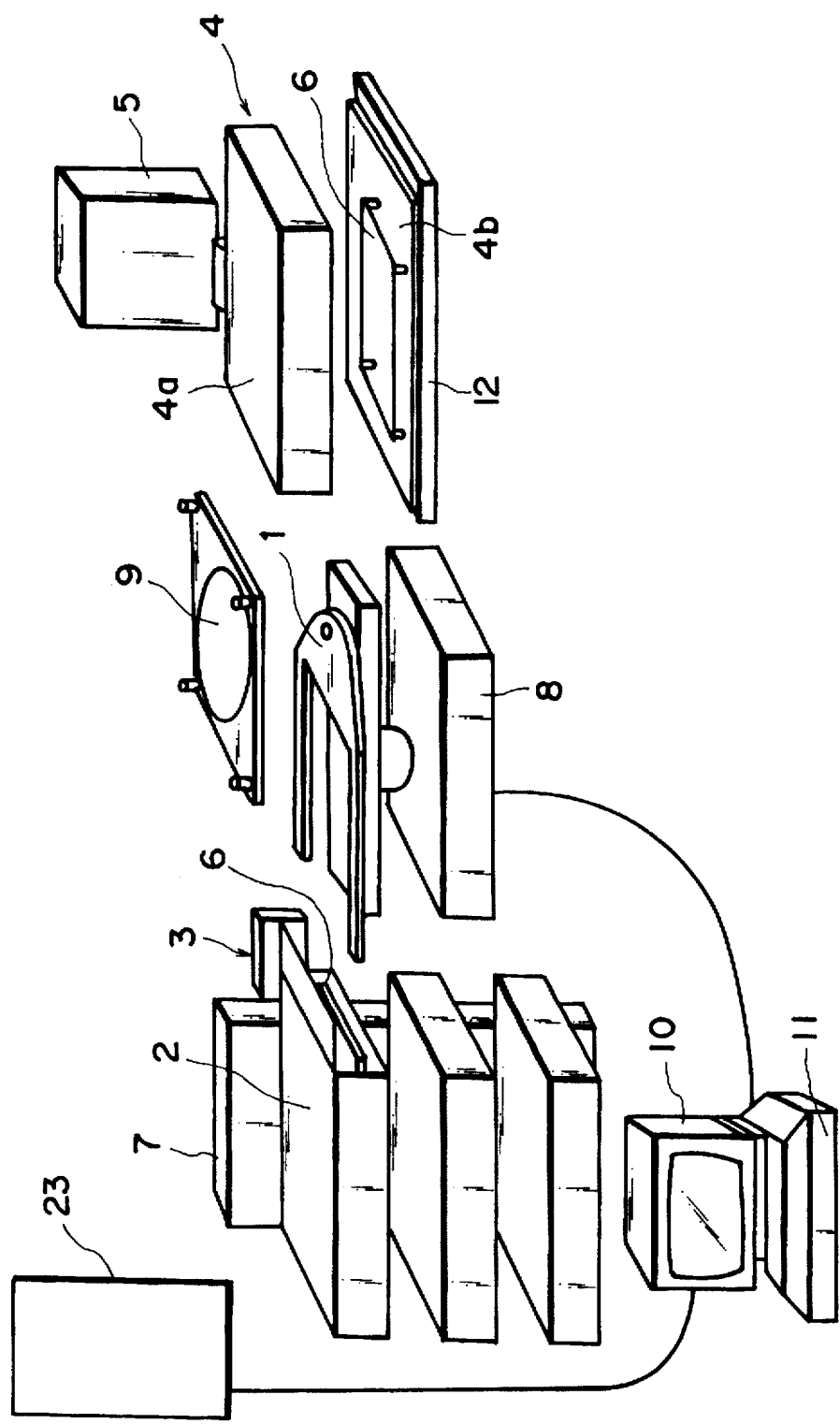
FIG. 1 is a schematic and perspective view of a portion of a semiconductor device manufacturing apparatus according to a first embodiment of the present invention, which portion relates to conveyance of a reticle.
Figure 2:
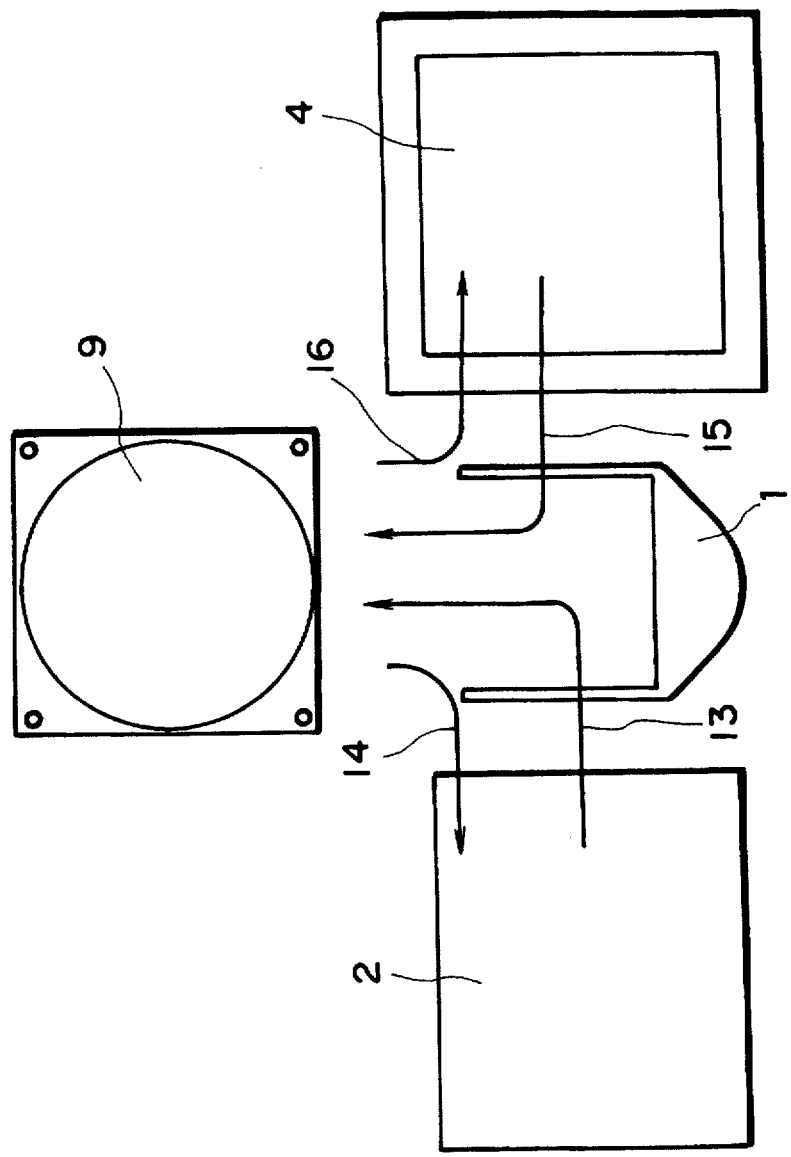
FIG. 2 is a plan view for explaining movement of a reticle in the semiconductor device manufacturing apparatus of the FIG. 1 embodiment.

Referring to FIGS. 1 and 2 showing a semiconductor device manufacturing apparatus according to a first embodiment of the present invention, denoted in FIG. 1 at 6 is a reticle, and denoted at 2 is a reticle cassette for storing a reticle therein. In this embodiment, a plurality of reticle cassettes 2 can be accommodated. Denoted at 7 is a cassette library, and denoted at 3 is a cassette opening/closing mechanism annexed to the cassette library 7. Denoted at 5 is a cassette opening/closing mechanism for opening and closing a cassette 4 with an upper cover 4a and a lower base 4b, having a shape different from that of the cassette 2. Denoted at 12 is a cassette table on which the cassette 4 can be placed, and denoted at 9 is a reticle stage on which a reticle is to be placed for execution of an exposure process.

Denoted at 1 is a reticle hand for unloading or loading a reticle out of or into the cassette 2 or the cassette 4, through vacuum attraction. Denoted at 8 is reticle hand driving means which serves to perform (i) rotational drive for changing the orientation of the reticle hand 1 toward the cassette 2, the cassette 4 or the reticle stage 9, for example, (ii) horizontal drive for expanding or contracting the reticle hand 1 along a horizontal direction, and (iii) vertical drive for moving the reticle hand upwardly and downwardly. Denoted at 11 is control means for controlling the reticle hand driving means 8, the cassette library 7 and the cassette table 12. Denoted at 10 is a display for displaying information about the state of operation of the reticle hand as well as information related to the cassette into which or out of which a reticle has been loaded or unloaded.

The control means is connected to a superordinate operational unit 23 to which a plurality of semiconductor device manufacturing apparatuses can be connected. The cassette 4 of different shape has the same shape as that of a cassette to be used in a reticle cleaning apparatus.

The operation of the apparatus will be described with reference to FIGS. 1 and 2.

For use of a reticle in the semiconductor device manufacturing apparatus, an operator loads the cassette 2, having a reticle 6 stored therein, into the semiconductor device manufacturing apparatus. Simultaneously therewith, a vacant cassette 4 usable with the cleaning apparatus is loaded. The control means 11 and the display means 10 are manipulated, and the reticle loading operation of the semiconductor device manufacturing apparatus starts. In response, the semiconductor device manufacturing apparatus performs discrimination as to whether there is reticle management information supplied from the operational unit 23, for selection of reticle management information to be used.

If there is reticle management information supplied from the operational unit 23, it is read into the control means 11. If there is no reticle management information supplied from the operational unit 23, reticle management information having already stored in the apparatus is read into the control means 11.

In response to the reading of the reticle management information, the control means 11 operates to actuate the cassette library 7 to move a designated cassette 2 to the position at the same level as the reticle hand 1, and to open a door of the cassette 2 through the cassette opening/closing mechanism 3.

As the door of the cassette 2 opens, the reticle hand 1 is rotationally moved toward the cassette 2 and, then, it is moved forwardly into the cassette 2. Subsequently, the reticle hand 1 is moved upwardly so that the reticle 6 within the cassette 2 is placed on the reticle hand 1. Thereafter, the reticle hand 1 holds the reticle 6 in the cassette 2 through vacuum attraction, whereby the reticle 6 is fixedly supported by the reticle hand 1. As the reticle 6 is held by vacuum attraction, the reticle hand 1 is moved backwardly and is rotationally moved toward the reticle stage 9. Then, it is moved forwardly and downwardly and, then, backwardly, whereby the reticle 6 is conveyed onto the reticle stage 9. As a result of this, the reticle 6 is displaced in the direction of an arrow 13 from the position of the cassette 2 in FIG. 2, and it is conveyed onto the reticle stage 9.

As the reticle 6 is conveyed onto the reticle stage 9, the control means 11 rewrites the data, in the reticle management information, regarding the number of operations in which the reticle has been used, to thereby renew that number. If the reticle management information used is the one having been supplied from the superordinate operational unit 23, the renewed reticle management information is transmitted back to the operational unit 23.

A pattern of the reticle 6 placed on the reticle stage 9 is projected and printed onto a semiconductor wafer (not shown) through the semiconductor device manufacturing apparatus. When a predetermined exposure process or processes are completed and the use of the reticle 6 is finished, for collection of the reticle 6 into the cassette 2, the operator starts the operation for unloading the reticle 6 from the semiconductor device manufacturing apparatus by using the control means 11 and the display 10. In response, the control means 11 checks the data, in the reticle management information, regarding the number of operations in which the reticle has been used (i.e., the number of operations in which the reticle has been conveyed onto the reticle stage 9 for execution of the pattern printing process).

If this number is less than a predetermined limitation number for use of the reticle, the control means 11 performs an operation that is the reverse of the reticle loading operation, whereby the reticle 6 is collected into the cassette 2 from the reticle stage 9. In response, completion of collection of the reticle 6 into the cassette 2 is displayed by the display 10. The motion of the reticle 2 described above corresponds to an arrow 14 in FIG. 2, and it means that the reticle 6 is unloaded from the reticle stage 9 into the cassette 2.

If the data in the reticle management information, concerning the number of operations in which the reticle has been used, is equal to the predetermined limitation number, the control means 11 controls the reticle hand 1 to collect the reticle 6 toward the cassette 4 side. More specifically, the reticle hand 1 is rotationally moved toward the reticle stage 9, and then it is moved forwardly and upwardly to hold the reticle 6 through vacuum attraction. Subsequently, the reticle hand 1 is moved backwardly and is rotationally moved toward the cassette 4. As the reticle hand 1 is moved rotationally toward the cassette 4, the cassette opening/closing mechanism 5 opens the upper cover 4a and the lower base 4b of the cassette 4. After the cassette 4 is opened, the reticle hand 1 is moved forwardly and downwardly to place the reticle 6 on the lower base 4b. As the reticle 6 is placed on the lower base 4b, the reticle hand 1 moves back and the opening/closing mechanism 5 closes the cassette 4. As the cassette 4 closing motion completes, the display 10 displays information that the reticle 6 has not moved back to the unloaded cassette 2 but it has been collected into the cassette 4. Also, the display 10 displays that the reticle 6 is the one which should be cleaned.

The operation described above corresponds to an arrow 16 in FIG. 2, and it means that the reticle 6 has been unloaded from the reticle stage 9 into the cassette 4.

The reticle 6 is cleaned by the cleaning apparatus (not shown) and, if the operator inputs a command to load the cleaned reticle 6 into the semiconductor device manufacturing apparatus, the cassette 4, unloaded from the reticle cleaning apparatus, is placed on the cassette table 12. Also, at the same time, a vacant cassette 2 is set in the cassette library 7.

After these cassettes are set in the semiconductor device manufacturing apparatus, the operator manipulates the control means 11 and the display 10 to start the reticle loading operation for loading the reticle into the semiconductor device manufacturing apparatus. In response, for selection of reticle management information to be used, the semiconductor device manufacturing apparatus checks whether there is reticle management information supplied from the superordinate operational unit 23.

If there is reticle management information supplied from the operational unit 23, the reticle management information from the operational unit 23 is read into the control means 11. If there is no reticle management information from the operational unit 23, reticle management information, having already stored in the apparatus, is read into the control means 11.

As the reticle management information is read, the control means 11 operates to cause the cassette opening/closing driving means 5 of the cassette table 12 to open the upper cover 4a and the lower base 4b of the cassette 4. As the cassette 4 opens, the reticle hand 1 is rotationally moved toward the cassette 4 and, then, it is moved forwardly and upwardly to hold the reticle 6 by vacuum attraction.

As the reticle 6 is held fixed by vacuum attraction, the reticle hand 1 is moved backwardly and it is moved rotationally toward the reticle stage 9. Subsequently, it is moved forwardly and downwardly, and then, backwardly whereby the reticle 6 is conveyed onto the reticle stage 9.

With this operation, the reticle 6 is moved along an arrow 15 from the position of the cassette 4 in FIG. 2, and it is conveyed onto the reticle stage 9.

As the reticle 6 is conveyed onto the reticle stage 9, the control means 11 erases the data, in the reticle management information, concerning the number of operations in which the reticle has been used, and it newly starts management of that number. If the used reticle management information is the one having been supplied from the operational unit 23, the renewed reticle management information is transmitted back to the operational unit 23.

After the reticle 6 is used so that it is to be collected back to a cassette, the operator manipulates the control means 11 and the display 10 to start the operation for unloading the reticle 6 from the semiconductor device manufacturing apparatus. In response, the control means 11 checks the data, in the reticle management information, regarding the number of operations in which the reticle has been used.

If this number is less than a predetermined limitation number for use of the reticle, the control means 11 performs an operation which is the reverse of the reticle loading operation, by which the reticle 6 is collected into the cassette 2 from the reticle stage 9. Completion of collection of the reticle 6 into the cassette 2 is displayed by the display 10. This operation corresponds to an arrow, 14 in FIG. 2, and it means that the reticle 6 has been collected into the cassette 2 from the reticle stage 9.

Figure 3:
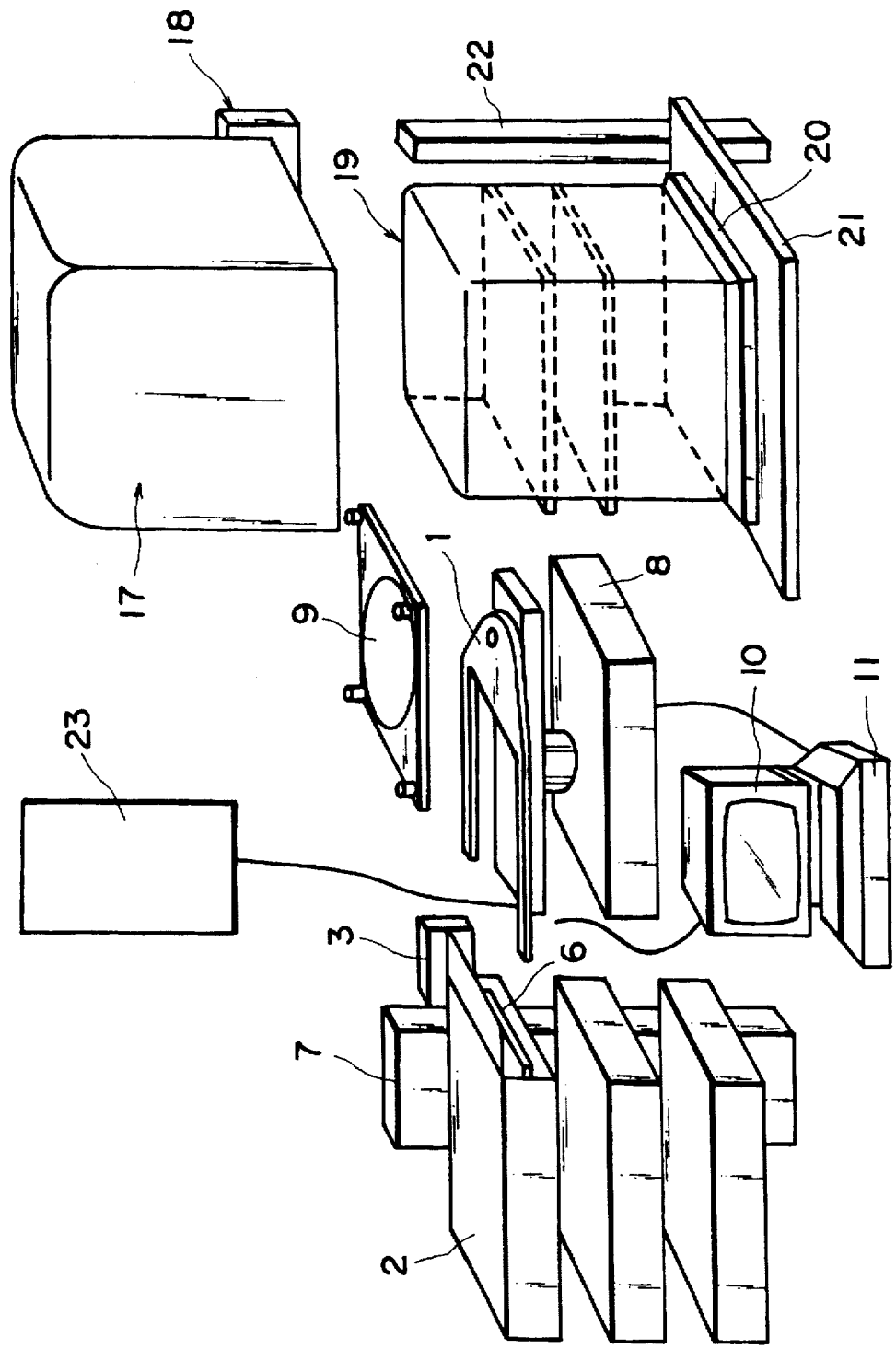
FIG. 3 is a schematic and perspective view of a portion of a semiconductor device manufacturing apparatus according to a second embodiment of the present invention, which portion relates to conveyance of a reticle.

FIG. 3 is a perspective view of a portion of a semiconductor device manufacturing apparatus according to a second embodiment of the present invention, which portion relates to reticle conveyance. This embodiment differs from the first embodiment in that: the cassette 4 of different shape shown in FIG. 1 is replaced by a cassette 19 which is adapted to accommodate a plurality of reticles 6; and the cassette 4, the cassette table 12 and the cassette opening/closing driving means 5 are replaced by the cassette 19 for plural reticles 6, an upper cassette cover 17 for accommodating the cassette 19, a cassette table 20, and a cassette cover opening/closing mechanism 18. The cassette cover opening/closing mechanism 18 serves to open or close a combination of the upper cassette cover 17 and the cassette table 20 on which the cassette 19 is placed.

The cassette 19 placed on the cassette table 20 is moved by means of an elevator mechanism 22 and a mounting table 21, along a Z direction, namely, upwardly and downwardly.

The cassette 19 has the same shape as that of a cassette used in a reticle particle-inspection apparatus, for example.

The operation of the semiconductor device manufacturing apparatus of this embodiment will be explained with reference to FIG. 3.

When a reticle is going to be used in the semiconductor device manufacturing apparatus, the operator uses a reticle particle-inspection apparatus (not shown) to perform an operation with a reticle 6 to be used, with respect to the adhesion of foreign particles thereto. The reticle 6 having its inspection completed is accommodated in the cassette 19, and the cassette 19 is held on the cassette table 20 and within the upper cassette cover 17.

The operator mounts the cassette 19, held by the cassette table 20 and the upper cassette cover 17, on the semiconductor device manufacturing apparatus and, at the same time, mounts a vacant cassette, which is used as a standard cassette in the semiconductor device manufacturing apparatus. Then, the operator manipulates the control means 11 and the display 10 to start the reticle loading operation of the semiconductor device manufacturing apparatus. In response, the semiconductor device manufacturing apparatus checks, for selection of reticle management information to be used, whether there is reticle management information supplied from the operational unit 23.

If there is reticle management information supplied from the operational unit 23, it is read into the control means 11. If there is no reticle management information supplied from the operational unit 23, the reticle management information, having already stored in the apparatus, is read into the control means 11.

As the reticle management information is read, the control means 11 operates to cause the cassette cover opening/ closing mechanism 18 to separate the upper cassette cover 17 and the cassette table 20 from each other. This brings the cassette 19 into a state in which it can be separated and moved downwardly.

As the cassette 19 is brought into a state in which it can be separated and moved downwardly, the elevator mechanism 22 moves the mounting table 21 downwardly until the position in the cassette, where the reticle 6 selected by the operator is placed comes to the same level as of the reticle hand 1.

As the elevator mechanism 21 moves the mounting table 21 to the position of the same level as the reticle hand 1, the reticle hand 1 is moved rotationally toward the cassette 19. Then, it is moved forwardly and upwardly into the cassette 2, so that the reticle hand 1 holds the reticle 6 in the cassette 2 by vacuum attraction. As the reticle 8 is held fixed by vacuum attraction, the reticle hand 1 is moved backwardly and, additionally, it is rotationally moved toward the reticle stage 9. Subsequently, it is moved forwardly and downwardly and, then, backwardly, by which the reticle 6 is conveyed onto the reticle stage 9.

With this operation, the reticle 6 is conveyed to the reticle stage 9, from the position of the cassette 12.

As the reticle 6 is conveyed onto the reticle stage 9, the control means 11 rewrites the data in the reticle management information, related to the reticle 6, and it renews the data regarding the number of operations in which the reticle has been used or the data regarding the apparatus which is going to be used subsequently. If the used reticle management information is the one having been supplied from the operational unit 23, the renewed reticle management information is transmitted back to the operational unit 23.

Upon completion of use of the reticle 6, for collecting the reticle 6 into the cassette, the operator uses the control unit 11 and the display 10 to start the operation for unloading the reticle 6 out of the semiconductor device manufacturing apparatus. In response, the control means 11 checks the data regarding the number of operations in which the reticle has been used or the data regarding the apparatus to be used subsequently.

If, in relation to use of the reticle 6, the same apparatus is to be used again, the control means 11 performs an operation that is the reverse of the reticle loading operation for loading the reticle 6 from the reticle stage 9, such that the reticle 6 is accommodated into the cassette 11, and collection of the reticle 6 into the cassette 11 is displayed by the display 10.

With this operation, the reticle 6 is collected from the reticle stage 9 to the cassette 11.

If a different apparatus is to be used subsequently, the control means 11 controls the reticle hand 1 to collect the reticle 6 into the cassette 2.

More specifically, the reticle hand 1 is rotationally moved toward the reticle stage 9 and, then it is moved forwardly and upwardly into the cassette 2. The reticle hand 1 then holds the reticle 6 in the cassette 2 by vacuum attraction, and it is then moved backwardly and rotationally toward the cassette 2.

As the reticle hand 1 is rotationally moved toward the cassette 2, the cassette library 7 opens the cassette 2 by using the cassette opening/closing mechanism 3. As the cassette 2 opens, the reticle hand 1 is moved forwardly and downwardly to place the reticle 6 in the cassette 2. As the reticle 6 is placed in the cassette 2, the reticle hand 1 moves backwardly. As the reticle hand 1 moves backwardly, the cassette opening/closing mechanism 3 of the cassette library 7 closes the cassette 2. As the cassette 2 closes, the reticle 6 does not move back to the cassette 19 from which the reticle 6 has been unloaded, and the display 10 displays that the reticle is collected into the cassette 2. Also, the display 10 displays the necessity of moving the reticle to a different apparatus.

With this operation, the reticle 6 is collected from the reticle stage 9 into the cassette 2.

If a reticle 6 having been unloaded from a separate apparatus is to be loaded into the semiconductor device manufacturing apparatus, the operator places a cassette 2 having been unloaded from the separate apparatus on the cassette library. Also, the operator places the cassette table 20 having the cassette 19 held thereon as well as the upper cassette cover 17, on the mounting table 21.

After these cassettes are set in the semiconductor device manufacturing apparatus, the operator manipulates the control means 11 and the display 10 to start the reticle loading operation of the semiconductor device manufacturing apparatus. In response, for selection of reticle management information to be used, the semiconductor device manufacturing apparatus checks whether there is reticle management information supplied from the operational unit 23.

If there is reticle management information supplied from the operational unit 23, it is read into the control means 11. If there is no reticle management information supplied from the operational unit 23, the reticle management information, having already stored in the apparatus, is read into the control unit 11.

As the reticle management information is read, the control means 11 moves the cassette 2 in the cassette library 7 to the position of the same level as the reticle hand 1. As the cassette 2 is moved up to this position, the cassette opening/closing mechanism 5 opens the door of the cassette 2. As the door of the cassette 2 opens, the reticle hand is rotationally moved toward the cassette 2 and, then, it is moved forwardly and upwardly, whereby the reticle is held through vacuum attraction.

As the reticle is held fixed by vacuum attraction, the reticle hand 1 is moved backward and is moved rotationally toward the reticle stage 9. Subsequently, it is moved forwardly and downwardly and, then, backwardly, whereby the reticle is conveyed onto the reticle stage 9.

With this operation, the reticle 6 is conveyed onto the reticle stage 9, from the position of the cassette 2.

As the reticle 6 is conveyed onto the reticle stage 9, the control means 11 rewrites the data in the reticle management information and renews the data in the reticle management information, regarding the number of operations in which the reticle has been used or the data regarding an apparatus to be used subsequently. If the used reticle management information is the one having been supplied from the operational unit 23, the renewed reticle management information is transmitted back to the operational unit 23.

While the invention has been described with reference to the structures disclosed herein, it is not confined to the details set forth and this application is intended to cover such modifications or changes as may come within the purposes of the improvements or the scope of the following claims.

What is claimed is:

1. A semiconductor device manufacturing apparatus, comprising:

a reticle library for accommodating therein a first reticle cassette;

a cassette table for holding thereon a second reticle cassette of a shape different from that of the first reticle cassette;

a first opening and closing mechanism for opening/closing the first reticle cassette in accordance with a predetermined first sequence;

a second opening and closing mechanism for opening/closing the second reticle cassette in accordance with a predetermined second sequence different from the first sequence;

a reticle stage for holding a reticle as unloaded from the first reticle cassette, for use of the reticle in said apparatus;

a reticle hand for conveying a reticle as unloaded from said reticle stage; and control means operable to discriminate one of the first and second reticle cassettes into which one cassette the reticle as unloaded from said reticle stage is to be accommodated, on the basis of reticle control information, said control means further being operable to move, through said reticle hand, the reticle into the first reticle cassette as being opened by said first opening and closing mechanism when said control means concludes that the reticle is to be accommodated in the first reticle cassette, and also to move, through said reticle hand, the reticle into the second cassette as being opened by said second opening and closing mechanism when said control means concludes that the reticle is to be accommodated in the second reticle cassette.

2. An apparatus according to claim 1, further comprising display means for displaying, to an operator, whether the unloaded reticle is moved to the first reticle cassette or the second reticle cassette.

3. An apparatus according to claim 1, wherein said control means uses information supplied thereto from an operational unit for controlling said apparatus and information stored in said apparatus, to execute the discrimination.

4. A semiconductor device manufacturing method, comprising the steps of:

placing a first reticle cassette in a reticle library, wherein the first reticle cassette can be opened and/or closed through a first opening and closing mechanism in accordance with a predetermined first sequence;

placing a second reticle cassette of a shape different from that of the first reticle cassette, on a cassette table, wherein the second reticle cassette can be opened and/or closed through a second opening and closing mechanism in accordance with a predetermined second sequence different from the first sequence;

opening the first reticle cassette by use of the first opening and closing mechanism;

placing a reticle, as unloaded from the first reticle cassette being opened by the first opening and closing mechanism, upon a reticle stage;

performing a process for manufacture of a semiconductor device, by use of the reticle placed on the reticle stage;

unloading the reticle from the reticle stage and conveying it through a reticle hand, after completion of the process;

discriminating, through control means, one of the first and second reticle cassettes into which one cassette the reticle as unloaded from the reticle stage is to be accommodated, on the basis of reticle control information; and moving, through the reticle hand, the reticle into the first reticle cassette as being opened by the first opening and closing mechanism when the control means concludes that the reticle is to be accommodated in the first reticle cassette, and moving, through the reticle hand, the reticle into the second cassette as being opened by the second opening and closing mechanism when the control means concludes that the reticle is to be accommodated in the second reticle cassette.

5. A method according to claim 4, wherein the control means performs said discriminating step on the basis of the number of operations of conveyance and use of the reticle on the reticle stage.

6. A method according to claim 5, further comprising the step of cleaning the reticle, as conveyed into the second reticle cassette, outside the second reticle cassette.

7. A method according to claim 6, wherein the second reticle cassette is adapted to accommodate plural reticles therein.

* * * * *

UNITED STATES PATENT AND TRADEMARK OFFICE
CERTIFICATE OF CORRECTION

PATENT NO. : 5,740,052
DATED : April 14, 1998
INVENTOR(S) : Nakamura

It is certified that error appears in the above-indentified patent and that said Letters Patent is hereby corrected as shown below:

ON THE COVER PAGE

[57] ABSTRACT, line 25

"accommodate" should read --accommodated--.

Column 1

Line 11, "original" should read --original,--.
Line 56, "operator" should read --operator,--.

Column 2

Line 60, "Within" should read --within--.

Column 6

Line 14, "arrow." should read --arrow--.
Line 21, "different" should read --a different--.
Line 23, "reticles" should read --reticle--.

UNITED STATES PATENT AND TRADEMARK OFFICE
CERTIFICATE OF CORRECTION

PATENT NO.  : 5,740,052
DATED       : April 14, 1998
INVENTOR(S) : Nakamura

It is certified that error appears in the above-indentified patent and that said Letters Patent is hereby corrected as shown below:

Column 7

Line 8, "cassette," should read --cassette 19,--.
Line 9, "placed" should read --placed,--.

Signed and Sealed this

Seventeenth Day of August, 1999

Attest:

Q. TODD DICKINSON

Attesting Officer

Acting Commissioner of Patents and Trademarks